United States Patent
St. Germain et al.

(10) Patent No.: US 11,711,200 B2
(45) Date of Patent: Jul. 25, 2023

(54) MULTIPHASE CLOCK GENERATORS WITH DIGITAL CALIBRATION

(71) Applicant: Analog Devices, Inc., Wilmington, MA (US)

(72) Inventors: Michael St. Germain, Boston, MA (US); John Kenney, West Windsor, NJ (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/644,693

(22) Filed: Dec. 16, 2021

(65) Prior Publication Data
US 2023/0198734 A1    Jun. 22, 2023

(51) Int. Cl.
*H03K 5/02* (2006.01)
*G06F 1/06* (2006.01)
(Continued)

(52) U.S. Cl.
CPC .................. *H04L 7/04* (2013.01); *G06F 1/06* (2013.01); *H03K 5/02* (2013.01); *H03L 7/081* (2013.01); *H04L 7/02* (2013.01)

(58) Field of Classification Search
CPC ......... H03L 7/08; H03L 7/081; H03L 7/0814; H04L 7/02; H04L 7/033; H04L 7/0331;
(Continued)

(56) References Cited

U.S. PATENT DOCUMENTS 6,753,712 B2    6/2004 Saeki
7,103,855 B2    9/2006 Saeki
(Continued)

FOREIGN PATENT DOCUMENTS

CN    106067814 B    12/2018
CN    110299911 B    1/2021

OTHER PUBLICATIONS

Chen et al., "A 4-to-16GHz Inverter-Based Injection-Locked Quadrature Clock Generator with Phase Interpolators for Multi-Standard I/Os in 7nm FinFET" 2018 IEEE International Solid-State Circuits Conference, in 3 pages.

(Continued)

*Primary Examiner* — Betsy Deppe
(74) *Attorney, Agent, or Firm* — Knobbe, Martens, Olson & Bear, LLP

(57) ABSTRACT

Apparatus and methods for multiphase clock generation are provided herein. In certain embodiments, a multiphase clock generator includes a first clock buffer that generates a first output clock signal based on a first input clock signal, a second clock buffer that generates a second output clock signal based on a second input clock signal, and a first clock interpolation circuit that generates a third output clock signal based on interpolating the first input clock signal and the second input clock signal. The first clock interpolation circuit generates the third output clock signal based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

20 Claims, 14 Drawing Sheets

(51) Int. Cl.
*H03L 7/081* (2006.01)
*H04L 7/02* (2006.01)
*H04L 7/04* (2006.01)

(58) Field of Classification Search
CPC ....... H04L 7/04; H04L 7/0079; H04L 7/0087; G06F 1/04; G06F 1/06; H03K 3/02
See application file for complete search history.

(56) References Cited

U.S. PATENT DOCUMENTS

| | | | |
|---|---|---|---|
| 7,180,352 B2 * | 2/2007 | Mooney | H03L 7/0814 |
| | | | 327/237 |
| 7,545,188 B1 | 6/2009 | Xu et al. | |
| 7,671,649 B2 | 3/2010 | Na | |
| 7,839,196 B2 | 11/2010 | Yoon | |
| 7,912,167 B2 | 3/2011 | Saeki | |
| 8,169,247 B2 | 5/2012 | Nedachi | |
| 8,446,302 B2 | 5/2013 | Miyashita | |
| 8,803,583 B2 * | 8/2014 | Nedachi | H03K 5/135 |
| | | | 327/251 |
| 9,379,881 B1 | 6/2016 | Chi et al. | |
| 9,698,968 B2 | 7/2017 | Bonaccio et al. | |
| 10,171,091 B2 | 1/2019 | Song et al. | |
| 10,873,443 B1 | 12/2020 | Walker et al. | |
| 2002/0053931 A1 | 5/2002 | Yamaguchi | |
| 2007/0177700 A1 | 8/2007 | Saeki | |
| 2014/0294132 A1 * | 10/2014 | Yamaguchi | H04L 7/033 |
| | | | 375/362 |
| 2021/0281253 A1 | 9/2021 | Kalcher et al. | |

OTHER PUBLICATIONS

Mansuri et al., "An On-Die All-Digital Delay Measurement Circuit with 250fs Accuracy" 2012 Symposium on VLSI Circuits Digest of Technical Papers, in 2 pages.

Toifl et al., "A 0.94-ps-RMS-Jitter 0.016-mm2 2.5-GHz Multiphase Generator PLL with 360 Digitally Programmable Phase Shift for 10-Gb/s Serial Links" IEEE Journal of Solid-State Circuits, vol. 40, No. 12, Dec. 2005, in 13 pages.

Partial European Search Report Issued for Application No. 22208280.2 dated May 5, 2023 in 14 pages.

* cited by examiner

MULTIPHASE CLOCK GENERATORS WITH DIGITAL CALIBRATION

FIELD OF THE DISCLOSURE

Embodiments of the invention relate to electronics, and more particularly, to multiphase clock signal generation.

BACKGROUND

A clock and data recovery (CDR) system can use a multiphase clock signal to capture data samples and edge samples from a serial data stream. In certain applications, it is desirable for more than two clock signal phases to be available to provide sampling at higher rates for a given clock signal frequency and/or to aid in deserialization, retiming, and/or other functions. CDR systems can be used in a variety of applications for recovering clock and data signals from a high-speed serial data stream.

Other example applications for multiphase clock signals include, but are not limited to, data processing systems, communication systems, timing systems, and/or optical networks.

SUMMARY OF THE DISCLOSURE

Apparatus and methods for multiphase clock generation are provided herein. In certain embodiments, a multiphase clock generator includes a first clock buffer that generates a first output clock signal based on a first input clock signal, a second clock buffer that generates a second output clock signal based on a second input clock signal, and a first clock interpolation circuit that generates a third output clock signal based on interpolating the first input clock signal and the second input clock signal. The first clock interpolation circuit generates the third output clock signal based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

In one aspect, a multiphase clock generator includes a first clock buffer configured to generate a first output clock signal based on buffering a first input clock signal, a second clock buffer configured to generate a second output clock signal based on buffering a second input clock signal, and a first clock interpolation circuit configured to generate a third output clock signal based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

In another aspect, a clock and data recovery (CDR) system is provided. The CDR system includes a data sampler configured to sample a data stream at a center, an edge sampler configured to sample the data stream at an edge, and a multiphase clock generator. The multiphase clock generator includes a first clock buffer configured to generate a first output clock signal for the data sampler based on buffering a first input clock signal, a second clock buffer configured to generate a second output clock signal for the data sampler based on buffering a second input clock signal, and a first clock interpolation circuit configured to generate a third output clock signal for the edge sampler based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

In another aspect, a method of multiphase clock generation is provided. The method includes buffering a first input clock signal to generate a first output clock signal using a first clock buffer, buffering a second input clock signal to generate a second output clock signal using a second clock buffer, and generating a third output clock signal based in interpolating the first input clock signal and the second input clock signal using a clock interpolation circuit, including multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

DETAILED DESCRIPTION OF EMBODIMENTS

Figure 1:
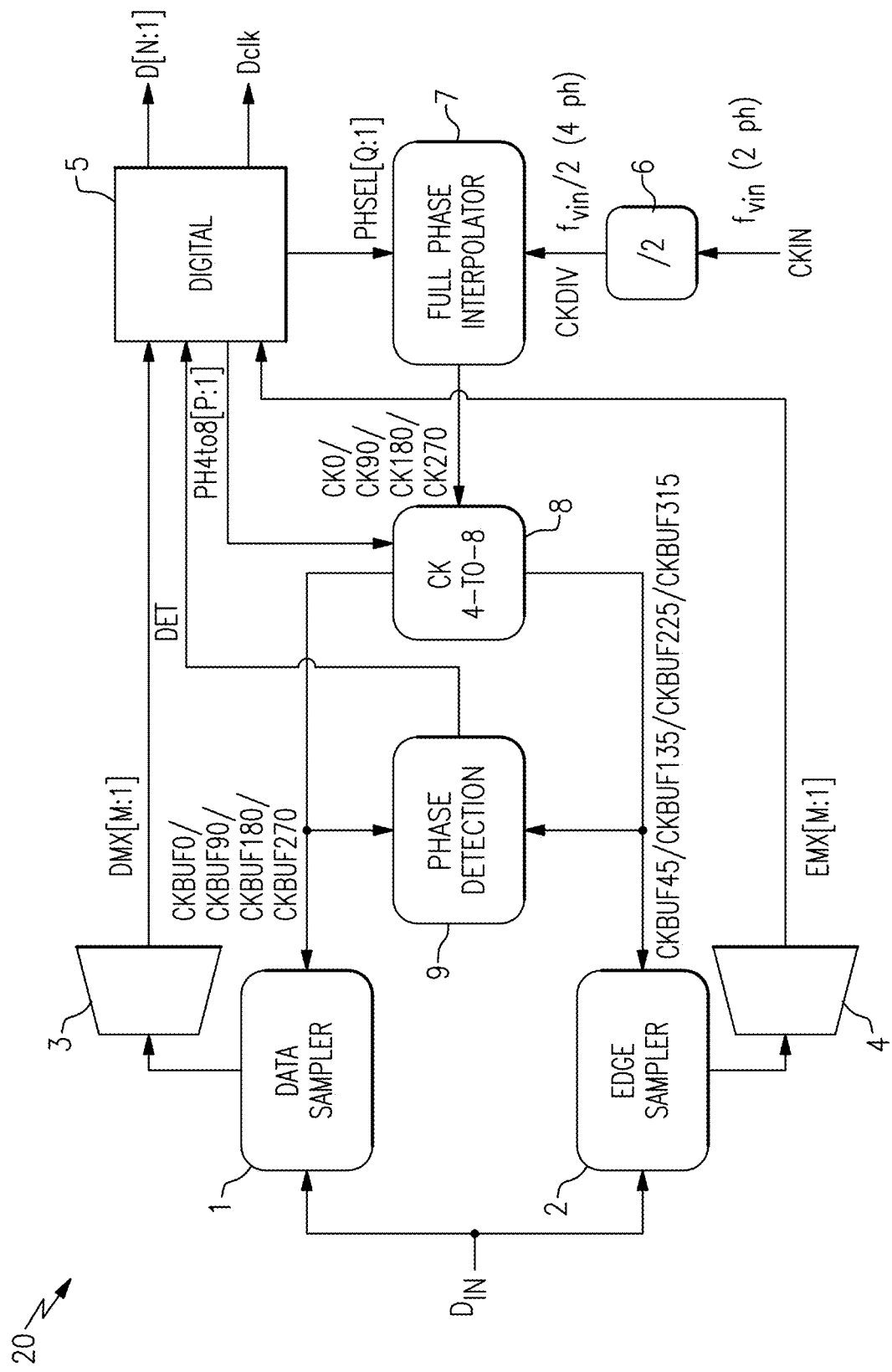
FIG. 1 is a schematic diagram of a clock and data recover (CDR) system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Digital data streams are often sampled with a multiphase clock signal in clock and data recovery (CDR) systems. In one example, a CDR system uses binary phase detectors to sample a non-return-to-zero (NRZ) data stream using a first sampling clock signal phase in the center of the bit period and a second sampling clock signal phase at the edge of the bit period. In such a system, the second sampling clock signal phase can be delayed by a half bit period relative to the first sampling clock signal phase.

To increase data rate for a given clock signal frequency, it is desirable in some CDR systems to use more than 2 clock signal phases for sampling a data stream. Multiphase clock generators can be used for such CDR systems as well as for other applications in need of multiple clock signal phases.

Apparatus and methods for multiphase clock generation are provided herein. In certain embodiments, a multiphase clock generator includes a first clock buffer that generates a first output clock signal based on a first input clock signal, a second clock buffer that generates a second output clock signal based on a second input clock signal, and a first clock interpolation circuit that generates a third output clock signal based on interpolating the first input clock signal and the second input clock signal. The first clock interpolation circuit generates the third output clock signal based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

The first adjustable current and the second adjustable current are controlled by a scaling factor α that can be set by digital calibration. For example, the first adjustable current can be scaled by (1-α) and the second adjustable current can be scaled by α, with α calibrated by way of feedback. For example, a phase detector can generate a phase detection signal based on comparing the third output clock signal to the first output clock signal and/or the second output clock signal, and a digital circuit can process the phase detection signal to set a value of α.

The multiphase clock generators herein can operate with lower power, smaller area, and/or less complexity than full phase interpolators. Moreover, enhanced accuracy can be achieved by way of digital calibration, which can be performed at start-up and/or intermittently during operation (for instance, as a background calibration routine without interrupting circuit operation).

The first input clock signal and the second input clock signal can have a nominal phase difference about 90 degrees (°), and thus the first output clock signal can have a 0° phase and the second output clock signal can have a 90° phase. Additionally, the third (interpolated) output clock signal lags the second output clock signal by about 45°, and thus can correspond to a 135° phase. Accordingly, the third output clock signal has a diagonal phase relationship with respect to the first output clock signal and the second output clock signal.

In certain implementations, the first interpolation circuit also outputs the logical complement of the interpolated clock signal as a fourth output clock signal having a 315° phase. Thus, the first interpolation circuit can be implemented differentially or otherwise include output circuitry for generating a pair of logically inverted output clock signals.

Moreover, additional buffers and/or interpolators can be included in the multiphase oscillator to generate additional diagonal interpolated phases as desired for a given application.

In one example, the multiphase clock generator is used in a CDR application in which the multiphase clock generator generates eight evenly spaced output clock signal phases from four evenly spaced input clock signal phases at the same frequency. By using interpolation to generate additional clock signal phases, binary phase detection is facilitated for both data and edge samples. Although an example of quarter-rate sampling is described, multiphase clock generation can also be used in a CDR application for other sampling rates, for instance, half-rate sampling or ⅛-rate sampling.

FIG. 1 is a schematic diagram of a CDR system 20 according to one embodiment. The CDR system 20 includes a data sampler 1, an edge sampler 2, a data deserializer 3, an edge deserializer 4, a digital circuit 5, a clock divider 6 (divide-by-two, in this example), a full phase interpolator 7, a multiphase clock generator 8 (four-to-eight, in this example), and a phase detection circuit 9.

Although the CDR system 20 of FIG. 1 illustrates one application for multiphase clock generators, the teachings herein are applicable to a wide variety of applications. Accordingly, the multiphase clock generators disclosed herein can be used in other implementations of electronic systems. Furthermore, the multiphase clock generators herein can operate using other numbers of input clock signal phases and/or output clock signal phases. An output clock signal is also referred to herein as a buffered clock signal.

In clocked circuits, such as those used for clock and data recovery in a serializer/deserializer (SERDES) application, certain phases are globally available, but additional phases must be generated locally using a small chip area and a low power consumption.

For example, the CDR system 20 of FIG. 1 depicts a quarter-rate deserializer architecture for processing an input data stream $D_{IN}$. As shown in FIG. 1, two phases of a half-rate clock signal CKIN (with frequency $f_{vin}$) are received by the CDR system 20. Additionally, the divider 6 divides the two clock phases by two to generate four phases of a quarter-rate clock signal CKDIV (with frequency $f_{vin}/2$). In certain implementations, the CDR system 20 is operable over a wide frequency range, for instance, at least an octave of frequency range such as 8 GHz to 16 GHz $f_{vin}$.

With continuing reference to FIG. 1, the full phase interpolator 7 receives the four clock signal phases from the divider 6 and a phase interpolator control signal PHSEL[Q: 1] (Q bits, in this example) from the digital circuit 5. The digital circuit 5 sets the value of the phase interpolator control signal PHSEL[Q:1] to align data samples to the center of the input data stream $D_{IN}$. Thus, the full phase interpolator 7 provides a rotation of all four clock phases together based on the phase interpolator control signal PHSEL[Q:1] to generate input clock signals CK0, CK90, CK180, and CK270, which are separated in phase by about 90° from one another.

The input clock signals CK0, CK90, CK180, and CK270 are suitable for sampling the center of the input data stream $D_{IN}$. However, to perform edge sampling, an additional four clock signal phases at the same frequency that are aligned to data transitions (edges of $D_{IN}$) are desired. Although full phase interpolators capable of interpolating to any arbitrary phase could be used to generate such clock signal phases, using full phase interpolators in this manner is prohibitively expensive in terms of area, power, and/or complexity.

As shown in FIG. 1, the multiphase clock generator 8 processes the input data clock signals CK0, CK90, CK180, and CK270 to generate output or buffered clock signals CKBUF0, CKBUF90, CKBUF180, and CKBUF270 provided to the data sampler 1 for capturing data samples DMX[M:1], and buffered clock signals CKBUF45, CKBUF135, CKBUF225, and CKBUF315 for capturing edge samples EMX[M:1]. In this example, DMX[M:1] and EMX[M:1] are M bit signals, where M can be, for example, 8 or other suitable value.

In the illustrated embodiment, the buffered clock signals CKBUF45, CKBUF135, CKBUF225, and CKBUF315 are offset by about 45° from the buffered clock signals CKBUF0, CKBUF90, CKBUF180, and CKBUF270, respectively.

With continuing reference to FIG. 1, the digital circuit 5 processes the edge samples EMX[M:1] to help determine whether data sampling is occurring early or late. For example, such processing can be used to update the word value of the phase interpolator control signal PHSEL[Q:1] in a delay-locked loop (DLL). The number of bits Q of the phase interpolator control signal PHSEL[Q:1] can be any suitable value, for instance, 4 or more.

The digital circuit 5 provides a phase control signal PH4to8[P:1] (P bits, in this example) to the multiphase clock generator 8 to provide digital calibration to the interpolation provided by the multiphase clock generator 8. In particular, the phase control signal PH4to8[P:1] controls a scaling parameter ($\alpha$) in accordance with the teachings herein. The number of bits P of the phase control signal PH4to8[P:1] can be any suitable value, for instance, at least 1 bit, or more particularly, 4 or more bits.

Although the phase control word PH4to8[P:1] is nominally used to ensure accurate clock phase, it can also be used to perform a self-measurement. For example, if the amplitude of low frequency jitter is sufficiently small, the DLL can be frozen (main phase word held constant). The data clocks will continue to sample data at eye center, while the edge clocks can be swept across the eye (PH4to8[P:1] swept in value). Moreover, bit errors can be tracked at each phase to generate a bathtub curve.

In the illustrated embodiment, the phase detection circuit 9 generates a phase detection signal DET based on measuring a phase difference between one or more of the buffered clock signals (CKBUF0, CKBUF90, CKBUF180, and/or CKBUF270) used for data sampling and one or more of the buffered clock signals (CKBUF45, CKBUF135, CKBUF225, and/or CKBUF315) used for edge sampling. The phase detection signal DET aids the digital circuit 5 in setting a word value of the phase control signal PH4to8[P:1].

The phase detection circuit 9 can perform phase detection or measurement as part of a calibration routine, for instance, as controlled by the digital circuit 5 at start-up or as part of a background process during operation of the CDR system 20.

As shown in FIG. 1, the digital circuit 5 generates a data stream D[N:1] (N bits, for instance, 32 bits) and a data clock signal Dclk based on the data and clock signal recovered from the input data stream $D_{IN}$. The clock and data signals can be used downstream by any suitable circuit desired for a particular application.

Figure 2A:
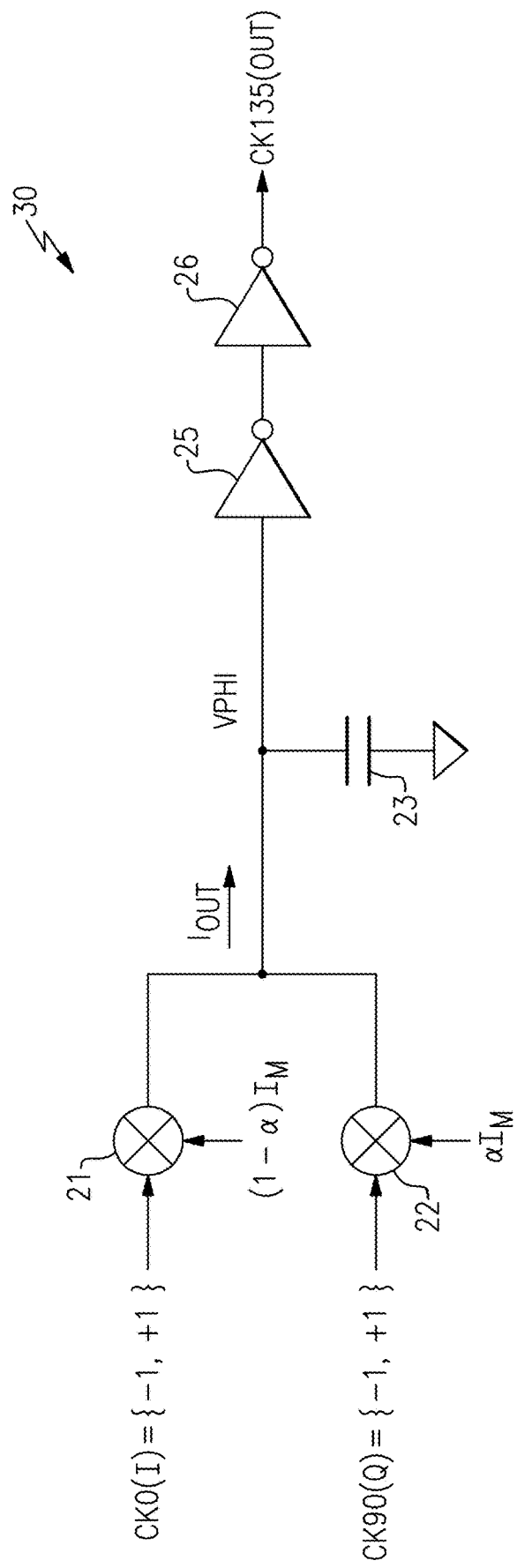
FIG. 2A is a schematic diagram of a clock interpolation circuit according to one embodiment.

FIG. 2A is a schematic diagram of a clock interpolation circuit 30 according to one embodiment. The clock interpolation circuit 30 includes a first current multiplier 21 (also referred to herein as a current commutator), a second current multiplier 22, an integration capacitor 23, a first output buffer 25, and a second output buffer 26.

As shown in FIG. 2A, the clock interpolation circuit 30 receives an in-phase clock signal (I or CK0) and a quadrature-phase clock signal (Q or CK90) and generates a diagonal clock phase (OUT or CK135), using current-based interpolation.

In particular the in-phase clock signal I and the quadrature-phase clock signal Q are multiplied by a first adjustable current $(1-\alpha)I_M$ and a second adjustable current $\alpha I_M$, respectively. By controlling the scaling parameter $\alpha$, the adjustable currents can be set from 0 to $I_M$ at full-scale. The first multiplied clock current ($I(1-\alpha)I_M$) outputted from the first current multiplier 21 is combined with the second multiplied clock current ($Q\alpha I_M$) from the second current multiplier 22 to generate an output current $I_{OUT}$ that is integrated on the capacitor 23 to generate a voltage VPHI.

When $\alpha=0.5$ and the input clock signals I and Q are ideal, VPHI is a trapezoidal waveform with a 45° delay relative to Q.

To account for non-idealities, $\alpha$ is controlled by a digital calibration loop (not shown in FIG. 2A) in accordance with the teachings herein.

Although a single clock interpolation circuit is shown, the clock interpolation circuit 30 of FIG. 2A can be replicated to generate additional diagonal phases.

Figure 2B:
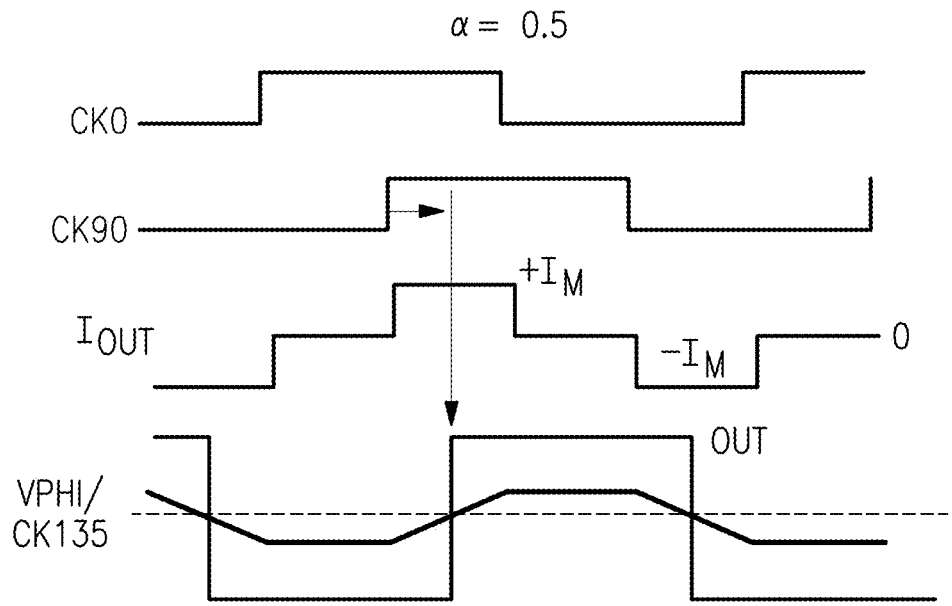
FIG. 2B is a graph of one example of waveforms for the clock interpolation circuit of FIG. 2A.

FIG. 2B is a graph of one example of waveforms for the clock interpolation circuit 30 of FIG. 2A. The graph includes plots of CK0 (I), CK90 (Q), $I_{OUT}$, VPHI, and CK135 (OUT) for an example simulation with $\alpha=0.5$. Plots for VPHI and CK135 are overlaid in FIG. 2B, with CK135 corresponding to the square wave.

Figure 2C:
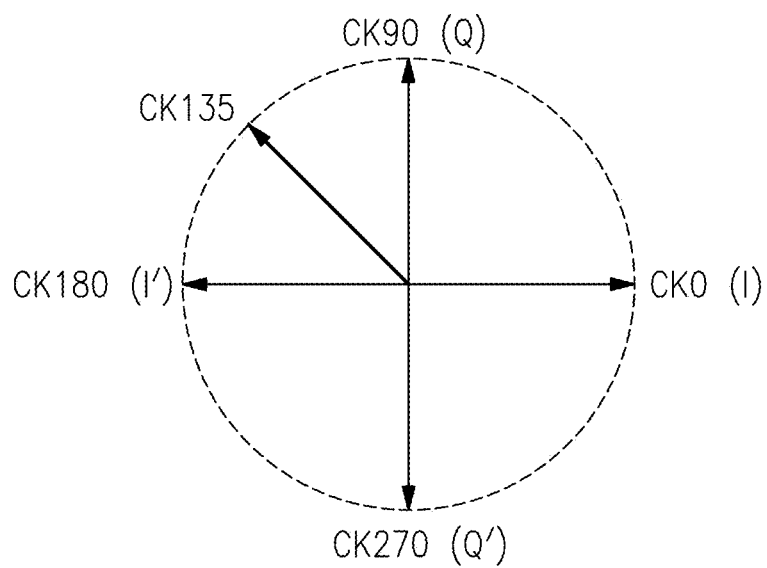
FIG. 2C is one example of a phasor diagram for the clock interpolation circuit of FIG. 2A.

FIG. 2C is one example of a phasor diagram for the clock interpolation circuit 30 of FIG. 2A. The diagram depicts various clock vectors, including I (CK0), Q (CK90), I' (CK180), and Q' (CK270). For a case in which the clock interpolation circuit 30 of FIG. 2A receives I and Q, an output clock signal CK135 with a 135° phase is generated. However, by providing other clock signals as inputs, other output clock signals can be generated.

For example, when the clock interpolation circuit 30 of FIG. 2A receives Q and I' as inputs, an output clock signal CK225 with a 225° phase is generated. Additionally, when the clock interpolation circuit 30 of FIG. 2A receives I' and Q' as inputs, an output clock signal CK315 with a 315° phase is generated. Furthermore, when the clock interpolation circuit 30 of FIG. 2A receives Q' and I as inputs, an output clock signal CK45 with a 45° phase is generated.

The clock interpolation circuit 30 of FIG. 2A can be replicated to generate any diagonal phases that are desired for a particular application. Moreover, by inverting the input clock signals and/or inverting the output clock signal any diagonal clock signal phase (45°, 135°, 225°, or 315°) can be generated. Thus, although shown for the case of I and Q input clock signal and a 135° output clock signal, other diagonal output clock signal phases are possible. Furthermore, the clock interpolation circuit 30 of FIG. 2A can be implemented differentially or otherwise include output circuitry for generating a pair of logically inverted output clock signals such that a diagonal phase and its 180° complement (which is also a diagonal phase) is generated.

Figure 2D:
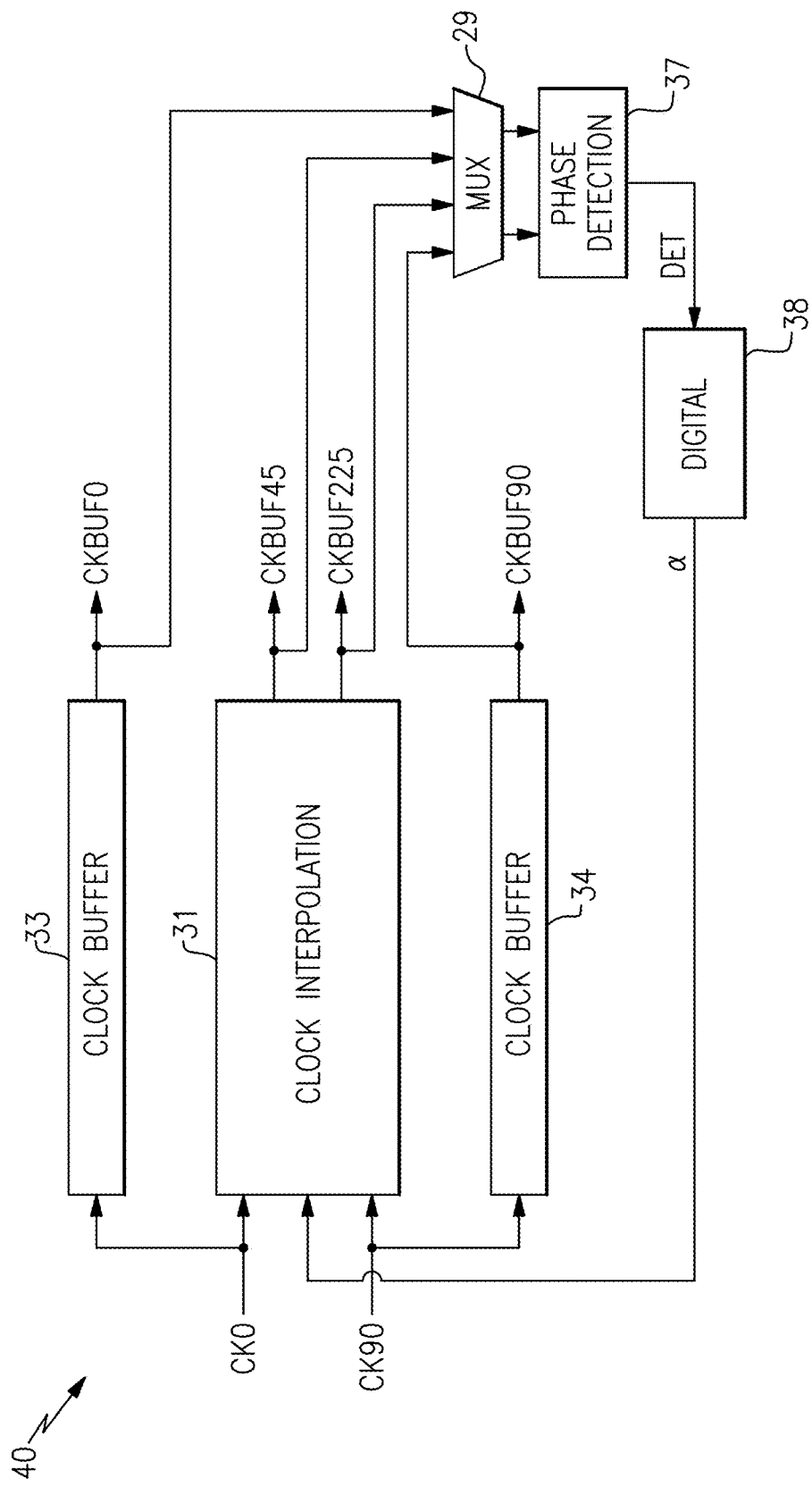
FIG. 2D is a schematic diagram of a multiphase clock generator according to one embodiment.

FIG. 2D is a schematic diagram of a multiphase clock generator 40 according to one embodiment. The multiphase clock generator 40 includes a multiplexer (MUX) 29, a clock interpolation circuit 31, a first clock buffer 33, a second clock buffer 34, a phase detection circuit 37, and a digital circuit 38.

As shown in FIG. 2D, the first clock buffer 33 buffers an input clock signal CK0 to generate an output clock signal CKBUF0, while the second clock buffer 34 buffers an input clock signal CK90 to generate an output clock signal CKBUF90. The input clock signals CK0 and CK90 have a nominal phase difference of 90°. The output clock signals CKBUF0 and CKBUF90 have the same frequency as the input clock signals and also have a nominal phase difference of 90°.

In the illustrated embodiment, the clock interpolation circuit 31 interpolates the input clock signal CK0 and the input clock signal CK90 to generate an output clock signal CKBUF45, which has the same frequency as the output clock signal CKBUF90 but with a 45° lag from the input clock signal CK0. The clock interpolation circuit 31 also generates the output clock signal CKBUF225, which is the logical complement of the output clock signal 45 and thus is 180° separated therefrom. The clock interpolation circuit 31 can be implemented differentially or otherwise include output circuitry for generating a pair of logically inverted output clock signals.

The first clock buffer 33 and the second clock buffer 34 are implemented (for instance, using delay elements such as inverters connected in a chain) to have a delay from input to output about equal to that of the clock interpolation circuit 31.

With continuing reference to FIG. 2D, the multiplexer 29 is implemented to provide any two selected output clock signals to the phase detection circuit 37 for phase comparison. The phase detection circuit 37 generates a phase detection signal DET based on detecting a phase difference between the selected output clock signals, for instance, the output clock signal CKBUF0 and the output clock signal CKBUF45. Although one example is described, the phase detection circuit 37 can be implemented to detect the phase difference between other pairs of output clock signals.

The digital circuit 38 processes the phase detection signal DET to control a scaling parameter α of the clock interpolation circuit 31. For example, the clock interpolation circuit 31 can multiply the input clock signal CK0 by a first adjustable current and the input clock signal CK90 by a second adjustable current, with the first adjustable current scaled by (1-α) and the second adjustable current scaled by α.

Thus digital calibration is achieved by feedback. The value of α can be set at start-up and/or intermittently updated during operation (for instance, as a background calibration routine without interrupting circuit operation).

Figure 2E:
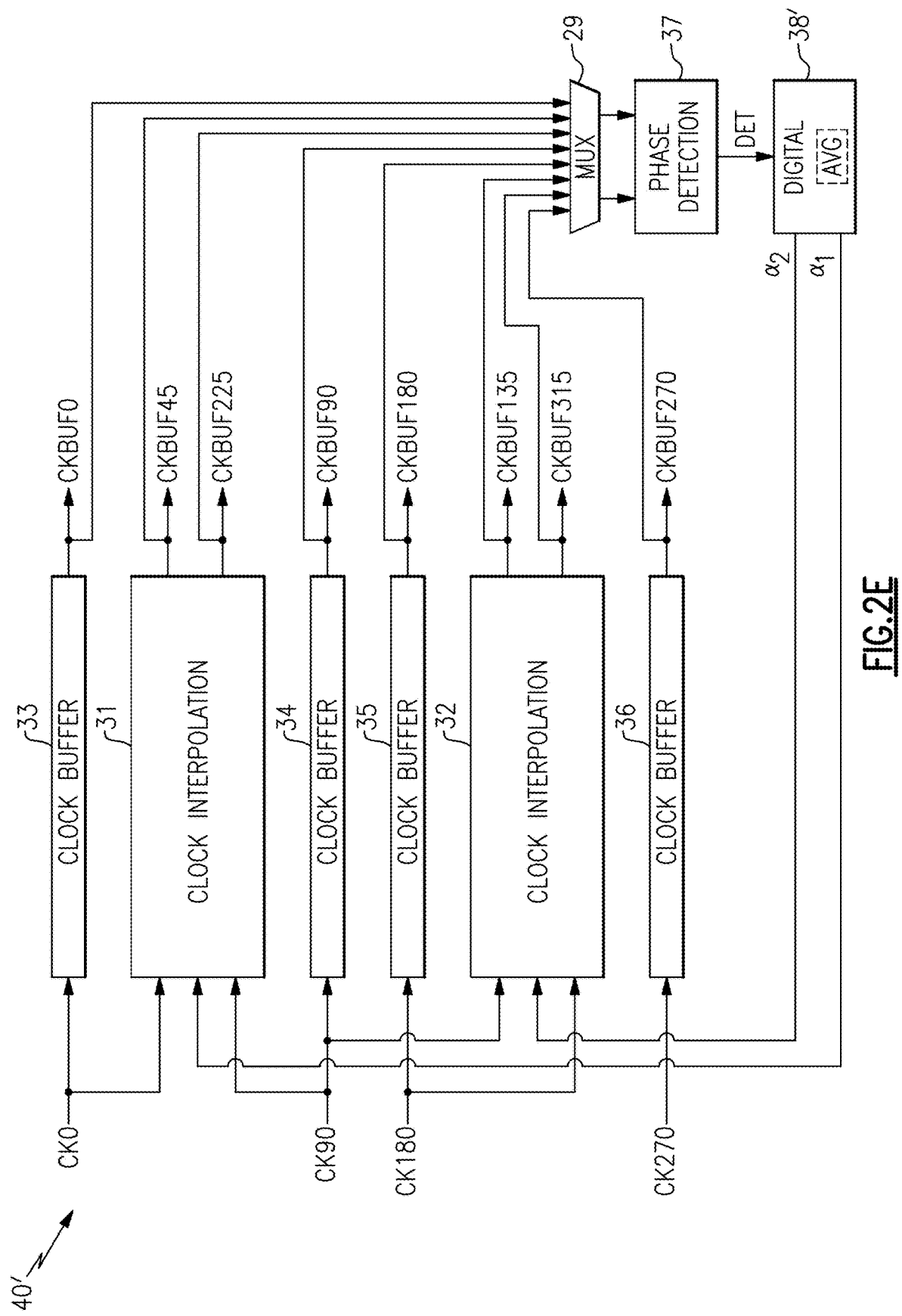
FIG. 2E is a schematic diagram of a multiphase clock generator according to another embodiment.

FIG. 2E is a schematic diagram of a multiphase clock generator 40' according to another embodiment. The multiphase clock generator 40' includes a first clock interpolation circuit 31, a second clock interpolation circuit 32, a first clock buffer 33, a second clock buffer 34, a third clock buffer 35, a fourth clock buffer 36, a phase detection circuit 37, and a digital circuit 38'.

In comparison the multiphase clock generator 40 of FIG. 2D, the multiphase clock generator 40' of FIG. 2E further includes the third clock buffer 35, the fourth clock buffer 36, the second clock interpolation circuit 32, and the multiplexer 29.

As shown in FIG. 2E, the third clock buffer 35 buffers the input clock signal CK180 to generate the output clock signal CKBUF180, while the fourth clock buffer 36 buffers the input clock signal CK270 to generate the output clock signal CKBUF270. Additionally, the second clock interpolation circuit 32 interpolates the input clock signal CK90 and the input clock signal CK180 to generate the output clock signal CKBUF135 and its logical complement, the output clock signal CKBUF315.

Furthermore, the multiplexer 29 is implemented to provide any two selected output clock signals to the phase detection circuit 37 for phase comparison. The phase detection signal DET is provided to the digital circuit 38' to aid in processing the results of various comparisons. In certain implementations, the digital circuit 38' includes an averaging circuit AVG for averaging the result of two or more different phase detections. The digital circuit 38' generates a first scaling signal $\alpha_1$ for the first clock interpolation circuit 31 and a second scaling signal $\alpha_2$ for the second clock interpolation circuit 32.

Figure 3A:
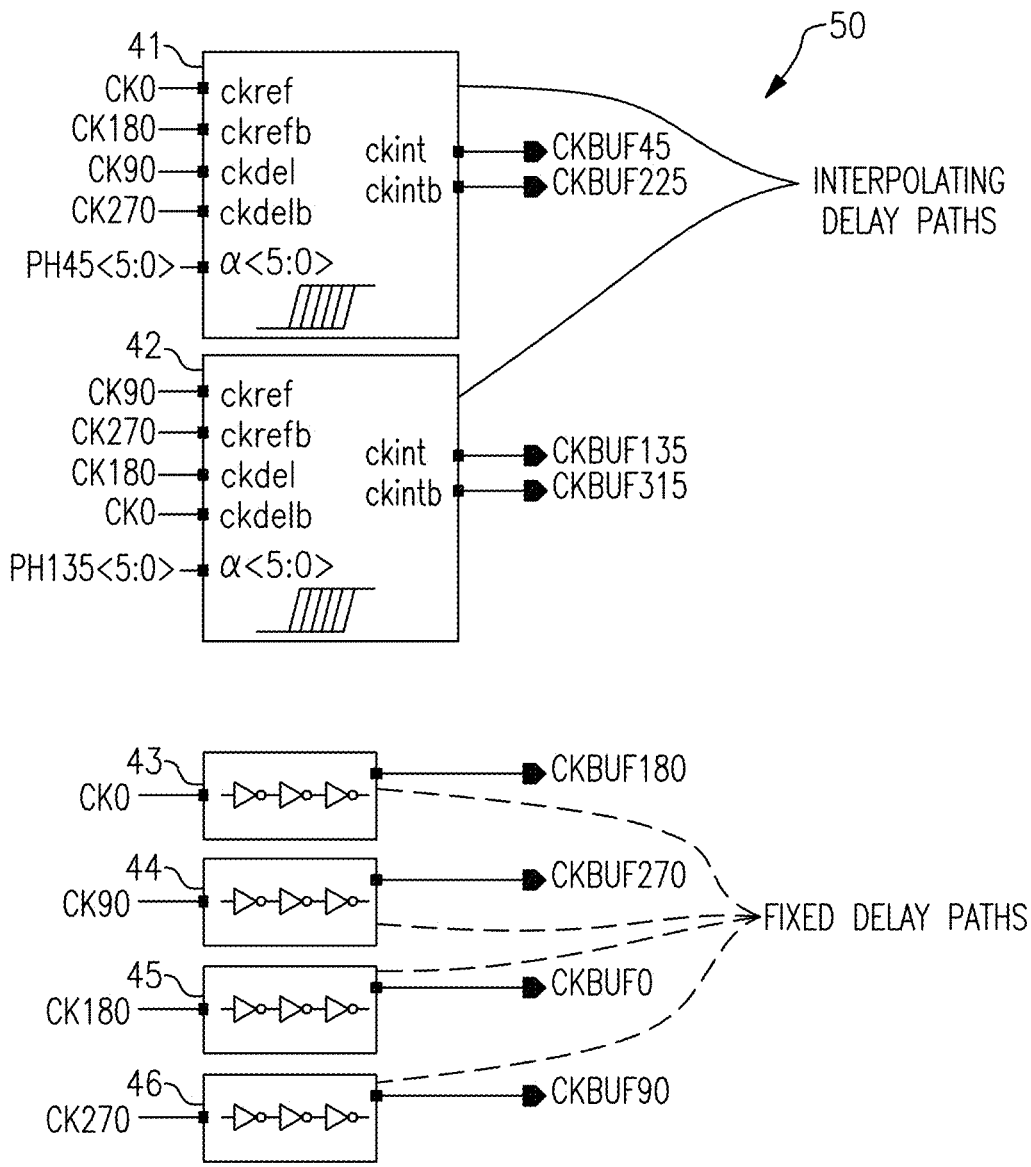
FIG. 3A is a schematic diagram of a multiphase clock generator according to another embodiment.
Figure 3B:
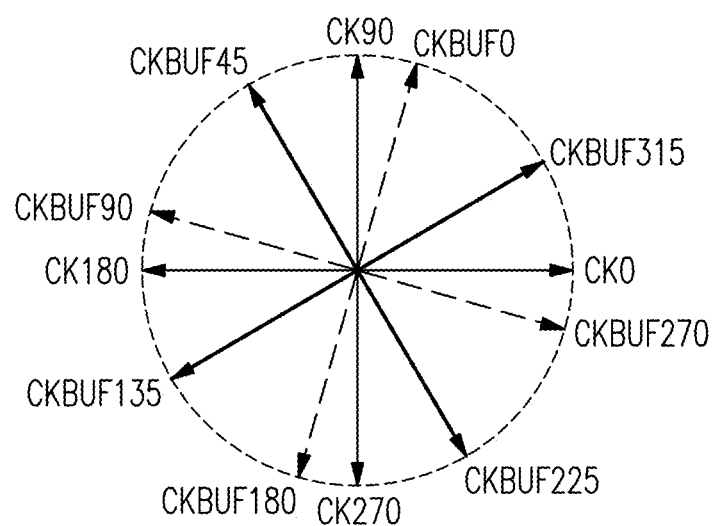
FIG. 3B is a graph of one example of a phasor diagram for the multiphase clock generator of FIG. 3A.

FIG. 3A is a schematic diagram of a multiphase clock generator 50 according to another embodiment. FIG. 3B is a graph of one example of a phasor diagram for the multiphase clock generator 50 of FIG. 3A.

In the illustrated embodiment, the multiphase clock generator 50 includes a first clock interpolation circuit 41, a second clock interpolation circuit 42, a first clock buffer 43, a second clock buffer 44, a third clock buffer 45, and a fourth clock buffer 46. Although not shown in FIG. 3A, the multiphase clock generator 50 can further include any calibration scheme disclosed herein. In one example, the calibration circuitry of FIG. 2E is included for calibrating the first clock interpolation circuit 41 and the second clock interpolation circuit 42.

With reference to FIGS. 3A and 3B, the first clock interpolation circuit 41 includes a first clock input (ckref) for receiving an input clock signal CK0, a second clock input (ckdel) for receiving an input clock signal CK90, a first inverted clock input (ckrefb) for receiving an input clock signal CK180, and a second inverted clock input (ckdelb) for receiving an input clock signal CK270. The first clock interpolation circuit 41 provides clock interpolation to generated buffered clock signals CKBUF45 and CKBUF225 at an output (ckint) and an inverted output (ckintb), respectively. The interpolation provided by the first interpolation circuit 41 is controlled by a first scaling control signal PH45<5:0> (6 bits, in this example) provided to a scaling input ($\alpha$<5:0>).

In the illustrated embodiment, the second clock interpolation circuit 42 includes a first clock input (ckref) for receiving the input clock signal CK90, a second clock input (ckdel) for receiving the input clock signal CK180, a first inverted clock input (ckrefb) for receiving the input clock signal CK270, and a second inverted clock input (ckdelb) for receiving the input clock signal CK0. Thus, the clock signals provided to the clock inputs of the second clock interpolation circuit 42 are delayed by 90° relative to the clock signals provided to the clock inputs of the first clock interpolation circuit 41. The second clock interpolation circuit 21 provides clock interpolation to generated buffered clock signals CKBUF135 and CKBUF315 at an output (ckint) and an inverted output (ckintb), respectively. The interpolation provided by the second interpolation circuit 42 is controlled by a second scaling control signal PH135<5:0> (6 bits, in this example) provided to a scaling input ($\alpha$<5:0>).

With continuing reference to FIGS. 3A and 3B, the first clock buffer 43 buffers the input clock signal CK0 to generate the buffered clock signal CKBUF180, the second clock buffer 44 buffers the input clock signal CK90 to generate the buffered clock signal CKBUF270, the third clock buffer 45 buffers the input clock signal CK180 to generate the buffered clock signal CKBUF0, and the fourth clock buffer 46 buffers the input clock signal CK270 to generate the buffered clock signal CKBUF90. Each of the clock buffers 43-46 can include one or more fixed delay elements for matching a delay (from input to output) of the interpolation circuits 41 and 42. For example, each of the clock buffers 43-46 can be implemented as a series of inverters that roughly match the nominal delay through the interpolating paths. By using inverters, low jitter and fast edges are maintained. In this example, an odd number of inverters is included and thus each buffered clock signal is logically inverted relative to the input clock signal. However, other implementations are possible.

The multiphase clock generator 50 uses a combination of fixed delay elements (included in the clock buffers 43-46) to generate CKBUF0, CKBUF90, CKBUF180, and CKBUF270 and two interpolating circuits to generate diagonal phases CKBUF45 and CKBUF135 and their logical complements CKBUF225 and CKBUF315, respectively.

The first interpolation circuit 41 and the second interpolation circuit 42 can provide current-based interpolation in accordance with the teachings herein.

Figure 4:
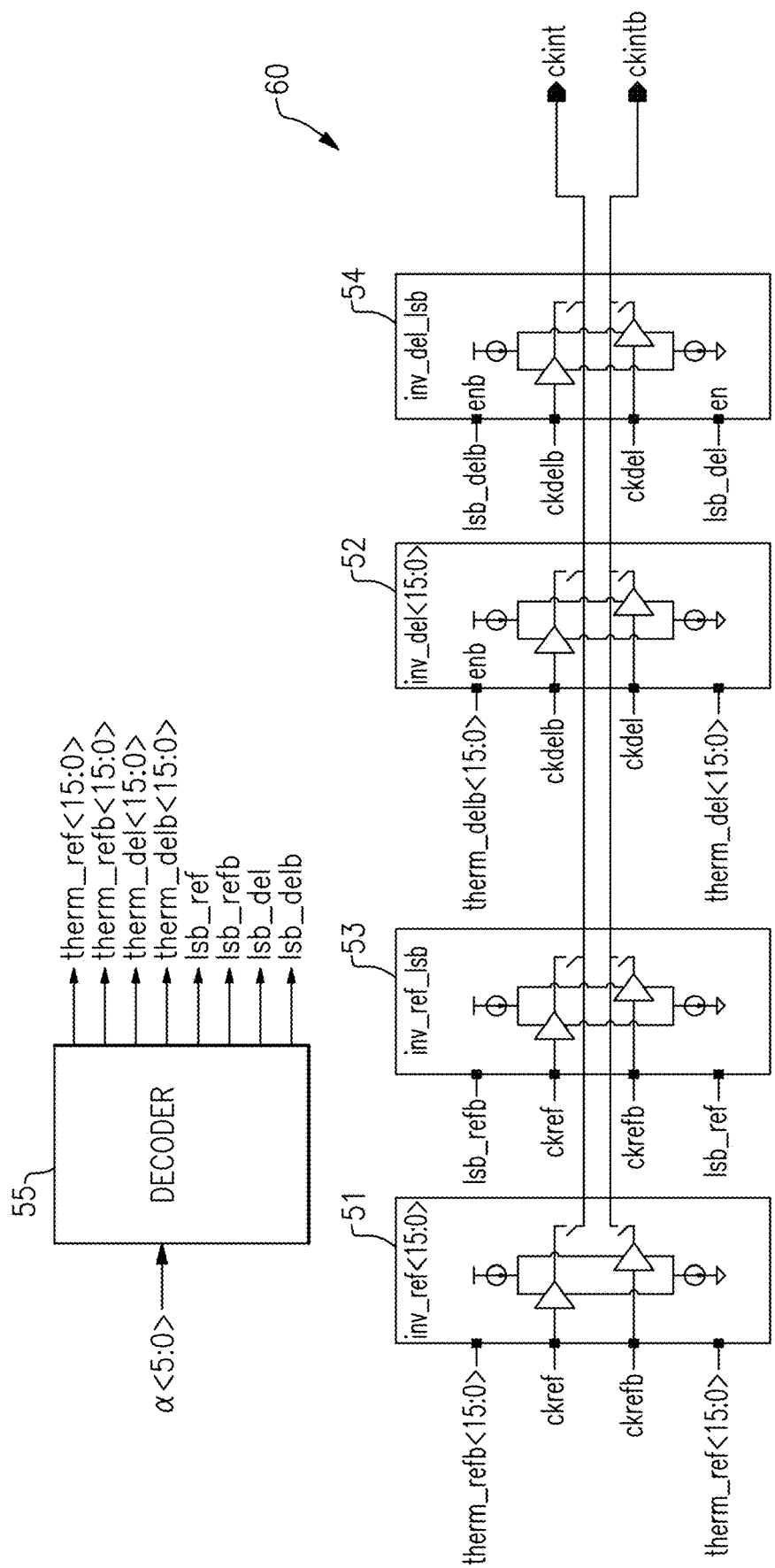
FIG. 4 is a schematic diagram of a clock interpolation circuit according to another embodiment.

FIG. 4 is a schematic diagram of a clock interpolation circuit 60 according to another embodiment. The clock interpolation circuit 60 includes a first bank of current-commutating cells 51 (inv_ref<15:0>, sixteen cells, in this example), a second bank of current-commutating cells 52 (inv_del<15:0>, sixteen cells, in this example), a first half unit current-commutating cell 53 (inv_ref_lsb), a second half unit current-commutating cell 54 (inv_del_lsb), and a decoder 55.

The clock interpolation circuit 60 of FIG. 4 illustrates one embodiment of a clock interpolation circuit suitable for use in the multiphase clock generator 50 of FIG. 3A. For example, two instantiations of the clock interpolation circuit 60 of FIG. 4 can be used to implement the first clock interpolation circuit 41 and the second clock interpolation circuit 42 shown in FIG. 3A.

In the illustrated embodiment, the clock interpolation circuit 60 includes the first bank of current-commutating cells 51 associated with a first clock input (ckref) and a first inverted clock input (ckrefb). The number of active cells of the first bank of current-commutating cells 51 is controlled by a first control signal (therm_ref <15:0>) and its complement (therm_refb <15:0>), which are generated by the decoder 55 based on the scaling signal α<5:0> for interpolation. The first half unit current-commutating cell 53 is also coupled to the first clock input (ckref) and the first inverted clock input (ckrefb), and is activated by a first half unit control signal (lsb_ref) and its complement (lsb_refb) provided by the decoder 55.

With continuing reference to FIG. 4, the clock interpolation circuit 60 further includes the second bank of current-commutating cells 52 associated with a second clock input (ckdel) and a second inverted clock input (ckdelb). The number of active cells of the second bank of current-commutating cells 52 is controlled by a second control signal (therm_del<15:0>) and its complement (therm_delb<15:0>), which are generated by the decoder 55 based on the scaling signal α<5:0>. The second half unit current-commutating cell 54 is also coupled to the second clock input (ckdel) and the second inverted clock input (ckdelb), and is activated by a second half unit control signal (lsb_del) and its complement (lsb_delb), which are provided by the decoder 55.

The clock interpolation circuit 60 operates to provide current-based interpolation to generate an interpolated clock signal (ckint) and its complement (ckintb).

In the illustrated embodiment, integration of the multiplied current is performed using capacitors corresponding to parasitic capacitance present at the nodes. Thus, no explicit capacitors are included, in this embodiment.

With reference to FIG. 4, sixteen slices of current-commutating unit cells 51 are connected to a reference clock (CKREF) and its complement (CKREFB), and 16 slices sixteen slices of current-commutating unit cells 52 connected to a delayed clock (CKDEL) and its complement (CKDELB). In one example, when ckref=CK0 and ckdel=CK90, ckint=CK45.

As shown in FIG. 4, there are additional half slice units, which are either both ON or both OFF. If these were not present, the LSB of a single phase step would be twice as large. Thus, including the half unit current-commutating cells 53 and 54 aids in enhancing resolution.

With continuing reference to FIG. 4, each of the slices of the banks 51 and 52 are either switched fully on or fully off. Nominally, 8 slices connected to ckref/ckrefb and 8 slices connected to ckdel/ckdelb are on and all other slices are off. This produces α=0.5 using the terminology from the embodiment of FIG. 2A.

Additionally, as the value of α<5:0> changes, a number of active slices in the bank 51 is changed relative to a number of active slices in the bank 52, with a total number of active slices constant. Thus, as α<5:0> varies, the strength (total current of active slices) of one bank versus the other bank is controlled.

In the illustrated embodiment, each slice of the banks is implemented as a pair of buffers (which can be non-inverting or inverting) biased by a top current source and a bottom current source, which are nominally equal. The buffers are also referred to as current-biased buffers since they are biased by top and bottom current sources. A switch is included at the output of each buffer to facilitate enabling or disabling of each slice.

Figure 5A:
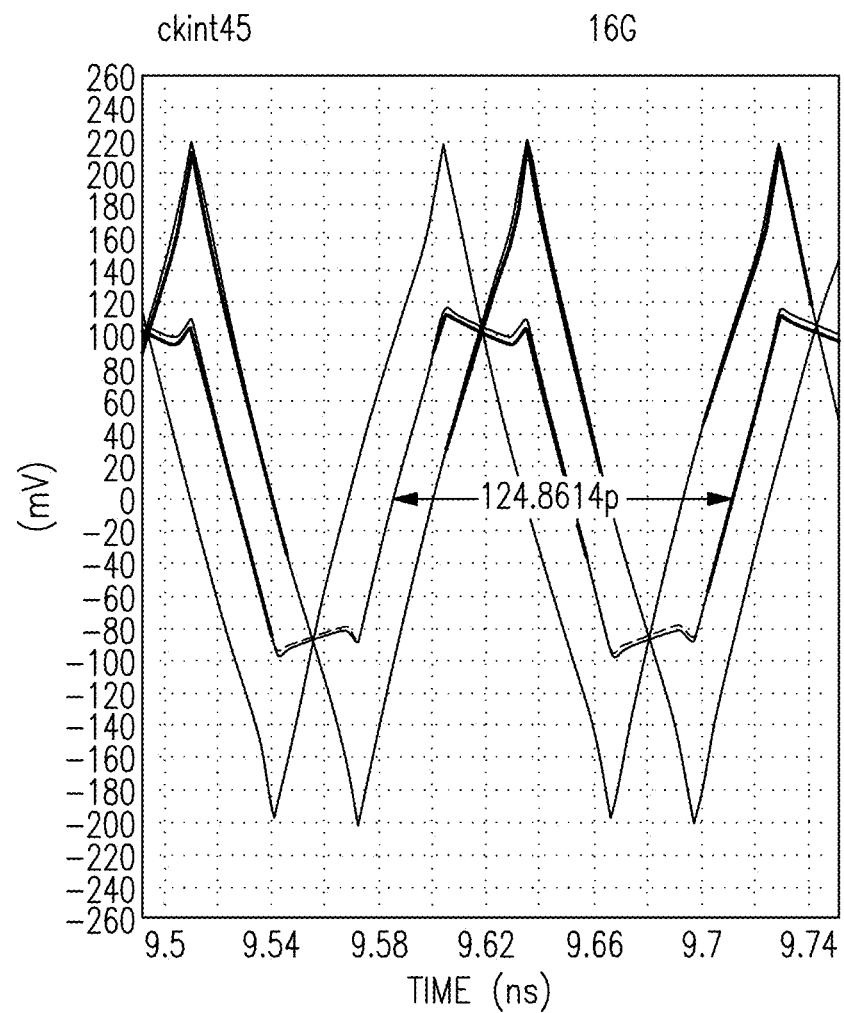
FIG. 5A is a graph of one example of voltage versus time waveforms for the clock interpolation circuit of FIG. 4.

FIG. 5A is a graph of one example of voltage versus time waveforms for the clock interpolation circuit 60 of FIG. 4. The plot shows the interpolated clock signal (ckint45) for digital word values corresponding to α=0, 0.5, and 1.0 for 16 GHz. The trapezoidal waveform in the middle of the two triangular waveforms is for α=0.5 which is desired.

Figure 5B:
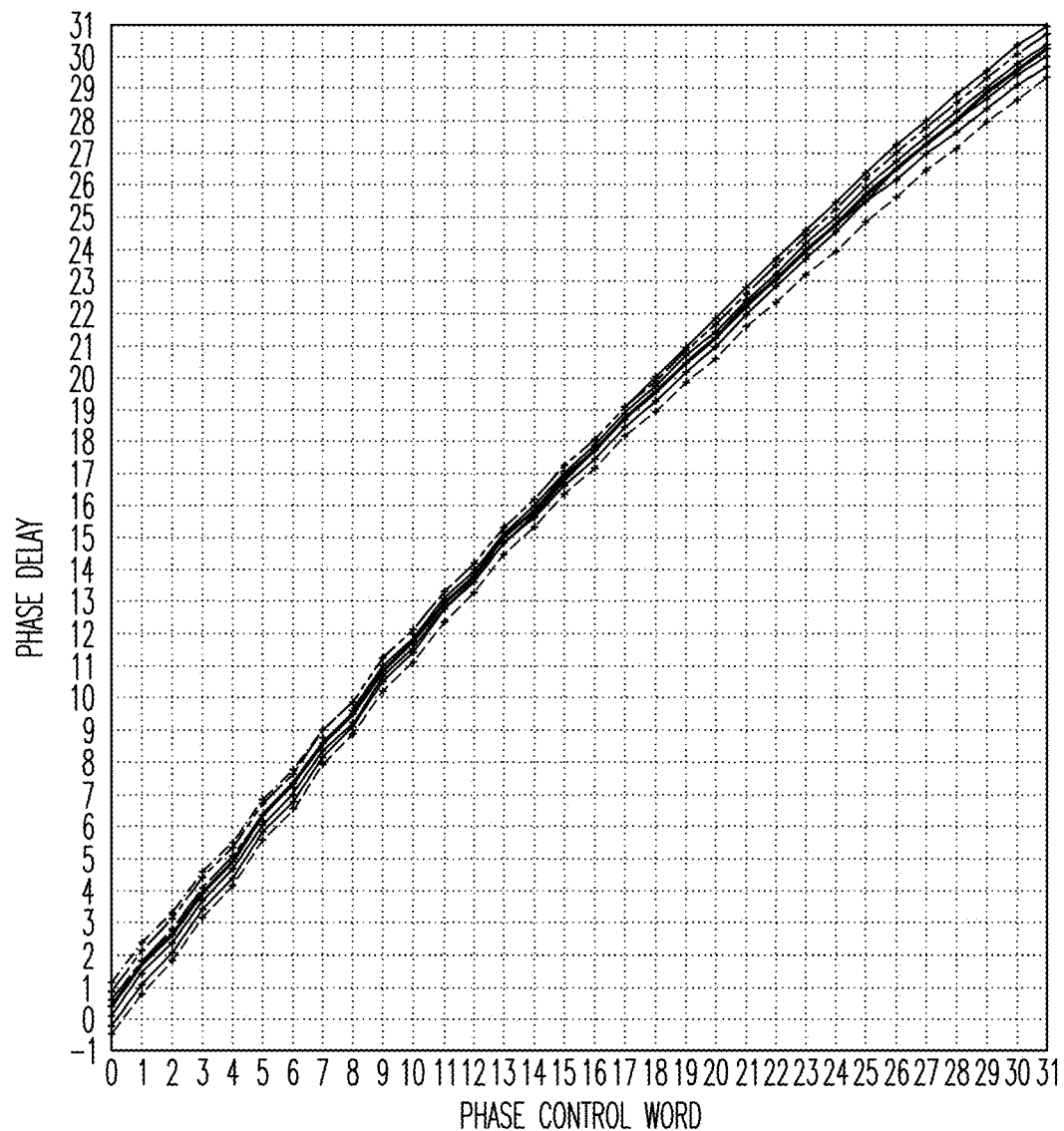
FIG. 5B is a graph of one example of phase delay versus digital phase control word for the clock interpolation circuit of FIG. 4.

FIG. 5B is a graph of one example of phase delay versus digital phase control word for the clock interpolation circuit 60 of FIG. 4.

The plot shows the phase difference in picoseconds between CKBUF0 and CKBUF45 as a function of the digital phase control word PH4to8[5:0]. At $f_{vin}$=16 GHz, the target skew between CKBUF0 and CKBUF45 is 15.625 ps, which can be achieved using a code of 14, in this example.

Figure 6A:
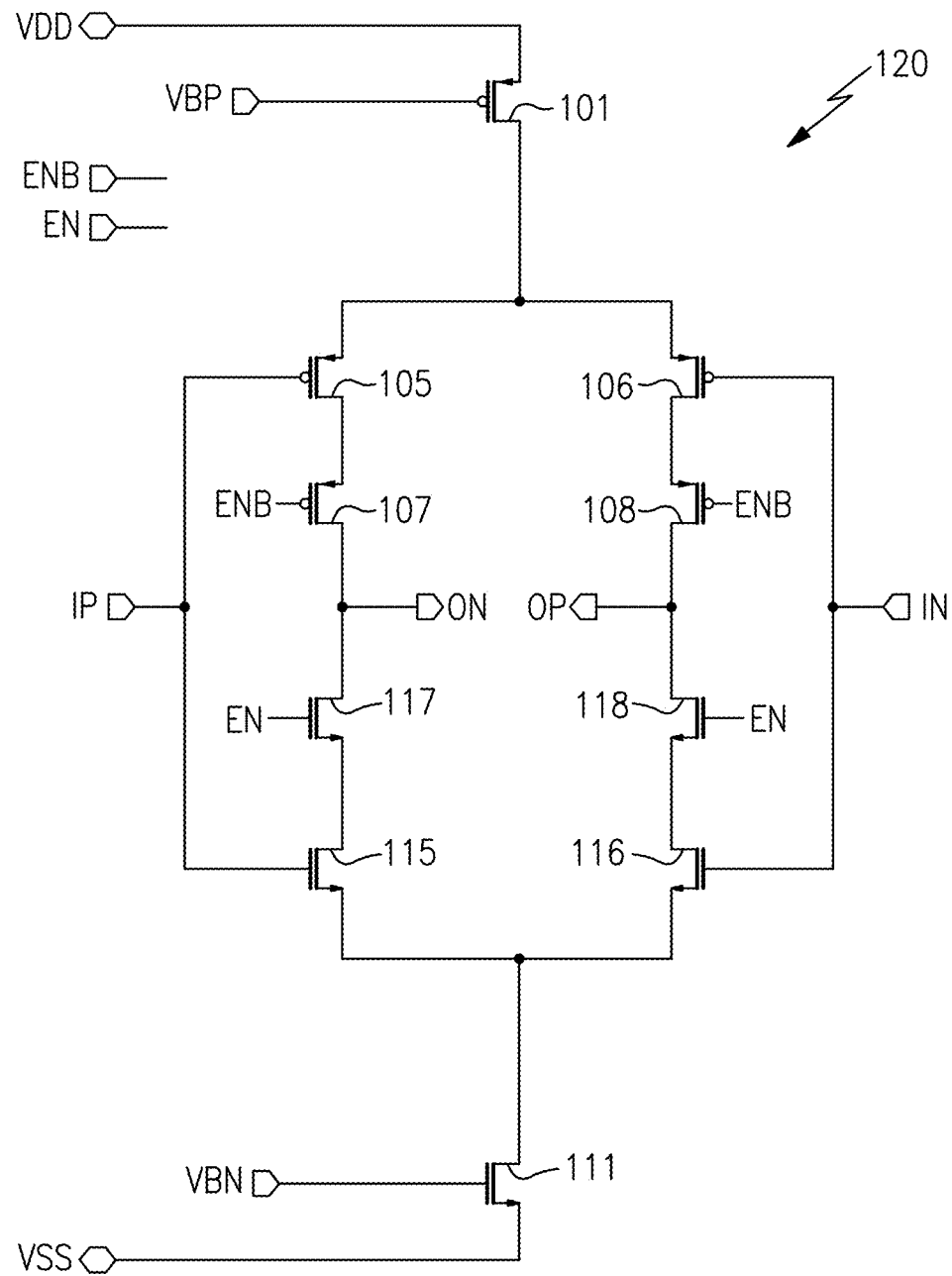
FIG. 6A is a schematic diagram of one embodiment of a unit interpolation cell for the clock interpolation circuit of FIG. 4.

FIG. 6A is a schematic diagram of one embodiment of a unit interpolation cell 120 for the clock interpolation circuit 60 of FIG. 4. The unit interpolation cell 120 includes a first current source p-type field-effect transistor (PFET) 101, a first clock PFET 105, a second clock PFET 106, a first enable PFET 107, a second enable PFET 108, a first current source n-type field-effect transistor (NFET) 111, a first clock NFET 115, a second clock NFET 116, a first enable NFET 117, a second enable NFET 118.

As shown in FIG. 6A, the first current source PFET 101 is connected between a supply node VDD and a top node. Additionally, a gate of the first current source PFET 101 is biased by a PFET bias input VBP that sets a current through the current source PFET 101.

In the illustrated embodiment, the first current source NFET 111 is connected in series between a ground node VSS and a bottom node. Additionally, a gate of the first current source NFET 111 is biased by an NFET bias input VBN that sets a current through the current source NFET 111.

In certain implementations, the PFET bias signal VBP and the NFET bias signal VBN are generated using a bias scheme using common-mode feedback, one example of which will be described in detail further below with respect to FIG. 7.

With continuing reference to FIG. 6A, the first clock PFET 105 and the first enable PFET 107 are connected in series between the top node and an inverted output ON, while the second clock PFET 106 and the second enable PFET 108 are connected in series between the top node and a non-inverted output OP. Additionally, the first clock NFET 115 and the first enable NFET 117 are connected in series between the bottom node and the inverted output ON, while the second clock NFET 116 and the second enable NFET 118 are connected in series between the bottom node and the non-inverted output OP.

As shown in FIG. 6A, a non-inverted input IP is connected to a gate of the first clock PFET 105 and a gate of the first clock NFET 115, while an inverted input IN is connected to a gate of the second clock PFET 106 and a gate of the second clock NFET 116. Additionally, an enable input EN is connected to a gate of first enable NFET 117 and a gate of the second enable NFET 118, while an inverted enable input ENB is connected to a gate of the first enable PFET 107 and a gate of the second enable PFET 108.

The clock PFETs 105/106 the clock NFETs 115/116 serve as current switching devices for steering the current from the current source PFET 101 and the current from the current source NFET 111, which are nominally equal. Additionally, enable PFETs 107/108 and enable NFETs 117/118 serve as enable switches that that will open when the unit interpolation cell 120 is disabled.

The PFETs and NFETs can be implemented in a wide variety of ways, such as using p-type metal-oxide-semiconductor (PMOS) transistors and n-type metal-oxide-semiconductor (NMOS) transistors, respectively.

Figure 6B:
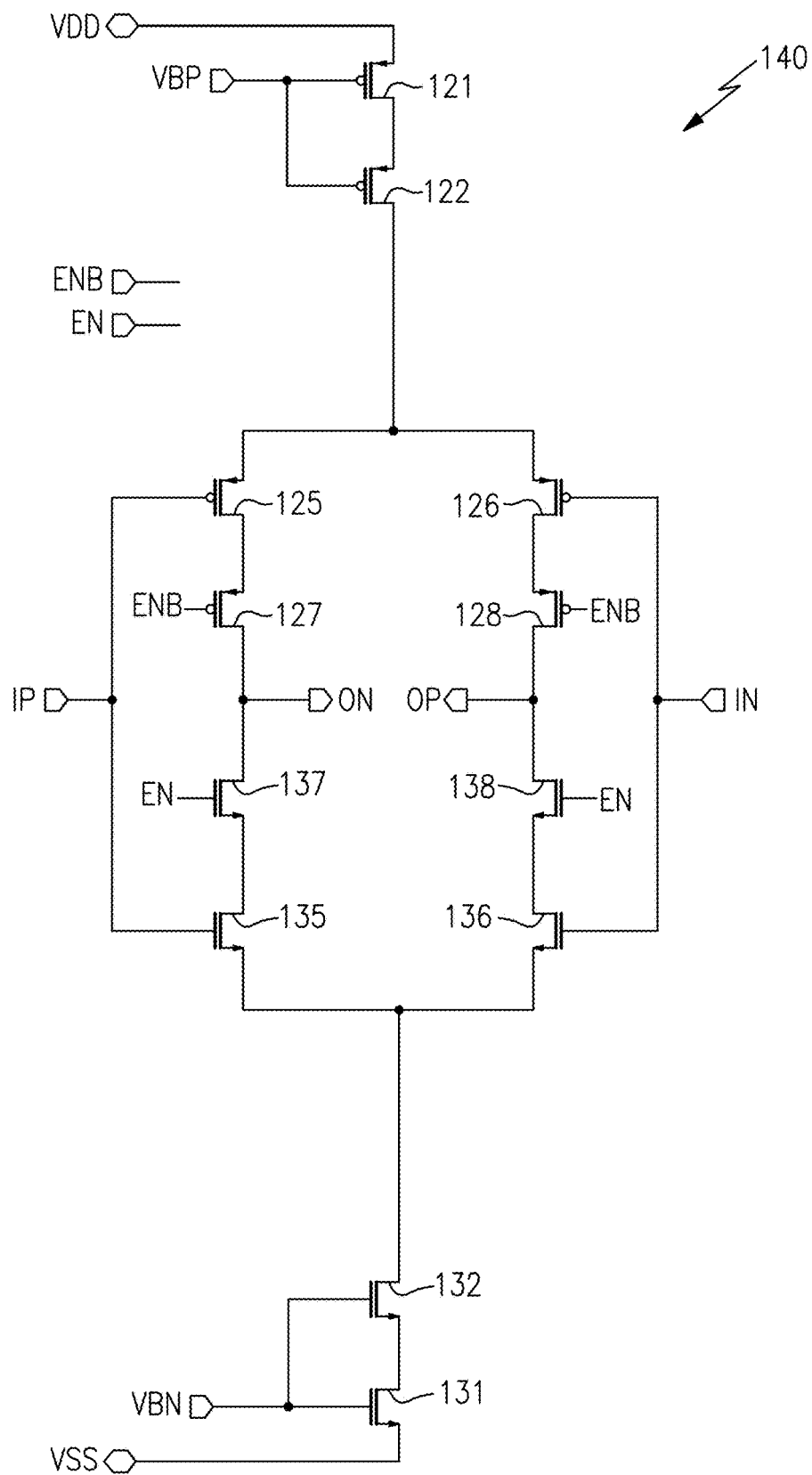
FIG. 6B is a schematic diagram of one embodiment of a half unit interpolation cell for the clock interpolation circuit of FIG. 4.

FIG. 6B is a schematic diagram of one embodiment of a half unit interpolation cell 140 for the clock interpolation circuit 60 of FIG. 4. The half unit interpolation cell 140 includes a first current source PFET 121, a second current source PFET 122, a first clock PFET 125, a second clock PFET 126, a first enable PFET 127, a second enable PFET 128, a first current source NFET 131, a second current source NFET 132, a first clock NFET 135, a second clock NFET 136, a first enable NFET 137, and a second enable NFET 138. The half unit interpolation cell 140 further includes a PFET bias input VBP, an NFET bias input VNP, a non-inverted input IP, an inverted input IN, a non-inverted output OP, and an inverted output ON.

The half unit interpolation cell 140 of FIG. 6B is similar to the unit interpolation cell 120 of FIG. 6A, except that the half unit interpolation cell 140 includes two current source PFETs 121-122 in series and two current source NFETs 131-132 in series to thereby reduce the currents by half relative to the unit cell 120.

Figure 7:
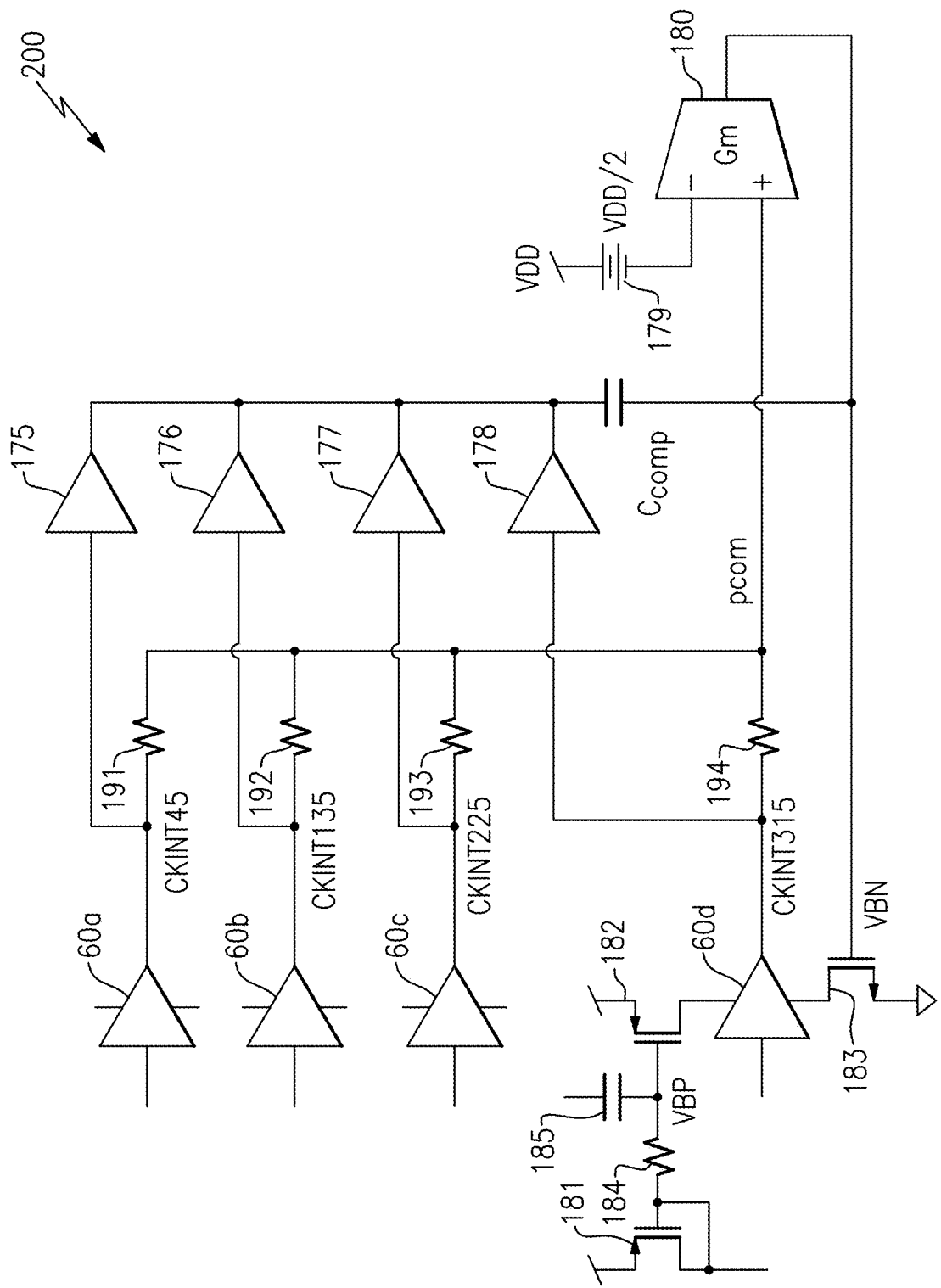
FIG. 7 is a schematic diagram of a feedback bias circuit for a clock interpolation circuit.

FIG. 7 is a schematic diagram of a feedback bias circuit 200 for a clock interpolation circuit. The feedback bias circuit 200 includes a first current-biased clock interpolation circuit 60a, a second current-biased clock interpolation circuit 60b, a third current-biased clock interpolation circuit 60c, a fourth current-biased clock interpolation circuit 60d, a first buffer 175, a second buffer 176, a third buffer 177, a fourth buffer 178, a voltage reference 179, a transconductance amplifier stage 180 (Gm stage 180), a reference PFET 181, a current source PFET 182 (implemented as a single PFET, in this example), a current source NFET 183 (implemented as a single NFET, in this example), a current mirror resistor 184, a current mirror capacitor 185, a first resistor 191, a second resistor 192, a third resistor 193, a fourth resistor 194, and a compensation capacitor $C_{comp}$.

The fourth current-biased clock interpolation circuit 60d is biased with a current from the current source PFET 182 and a current from the current source NFET 183, which are nominally equal. The current source PFET 182 is connected with the reference PFET 181 to form a current mirror for setting the PFET bias voltage VBP for the current source PFET 182 as well as for the other current-biased clock interpolation circuits. Additionally, the current mirror resistor 184 and the current mirror capacitor 185 are included to provide filtering of the PFET bias voltage VBP.

The clock interpolation circuits 60a-60d can each be implemented in accordance with the clock interpolation circuit 60 of FIG. 4, and thus can represent banks of current-biased buffers each biased by VBP and VBN.

With continuing reference to FIG. 7, in this embodiment the PFET bias voltage VBP is fixed by the current mirror, while the NFET bias voltage VBN is controlled with a servo loop to keep OP and ON at about half the reference voltage (VDD/2, in this example) from the reference voltage source 179. In another embodiment, the NFET bias voltage VBN is fixed while the PFET bias voltage VBP is controlled with a servo loop.

In this embodiment, the common-mode feedback is generated by taking an average (pcom) of the interpolated clock outputs (CKINT45, CKINT135, CKINT225, and CKINT315), and comparing the average (pcom) to a reference (VDD/2). The error voltage is amplified by the Gm stage 180 and VBN is driven until the error voltage is minimized (close to 0).

As shown in FIG. 7, frequency compensation (Miller compensation) is achieved at VBN by using buffers 175-178 (for instance, PMOS source followers) to drive $C_{comp}$.

Figure 8:
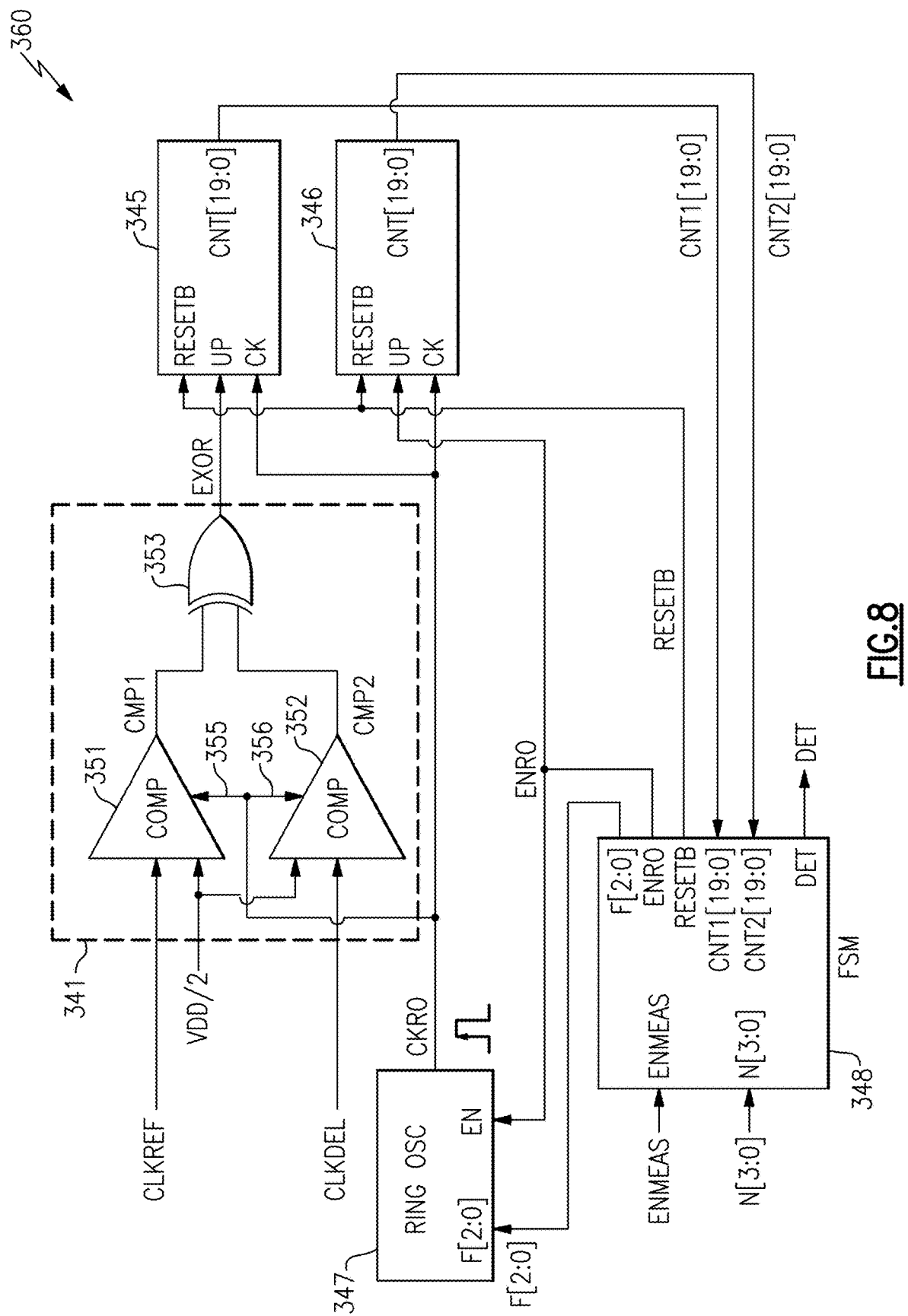
FIG. 8 is a schematic diagram of a phase detection circuit according to one embodiment.

FIG. 8 is a schematic diagram of a phase detection circuit 360 according to one embodiment. The phase detection circuit 360 illustrates one embodiment of a phase detection circuit for determining a phase detection signal DET that is processed by a digital circuit to set a scaling factor (α) of a clock interpolator. For example, the phase detection circuit 360 depicts one embodiment of the phase detection circuit 9 of FIG. 1. However, phase detection circuits can be implemented in other ways.

In the illustrated embodiment, the phase detection circuit 360 includes a quantization and logic circuit 341, a first counter 345, a second counter 346, a ring oscillator 347, and a finite state machine (FSM) 348.

With reference to FIG. 8, the quantization and logic circuit 341 processes a reference clock signal CLKREF (for example, CKBUF0) and a delayed clock signal CLKDEL (for example, CKBUF45) to generate an exclusive-OR signal EXOR indicating when the reference clock signal CLKREF and the delayed clock signal CLKDEL are in different states.

In the illustrated embodiment, the quantization and logic circuit 341 includes a first comparator 351, a second comparator 352, and an XOR gate 353. However, other implementations are possible. For example, different types of quantization circuits (also referred to herein as quantizers)

aside from comparators (for instance, latches) and/or different types of logic gates can be used.

The first comparator 351 is controlled by a ring oscillator clock signal CKR0, and generates a first comparison signal CMP1 based on comparing the reference clock signal CLKREF to a threshold signal VDD/2. Additionally, the second comparator 352 is controlled by the ring oscillator clock signal CKRO, and generates a second comparison signal CMP2 based on comparing the delayed clock signal CLKDEL to the threshold signal VDD/2. The XOR gate 353 generates the exclusive-OR signal EXOR based on performing an exclusive-OR operation on the first comparison signal CMP1 and the second comparison signal CMP2.

As shown in FIG. 8, a first balanced clock signal route 355 and a second balanced clock signal route 356 are used to provide the ring oscillator clock signal CKR0 to the first comparator 351 and the second comparator 352. Such techniques aid in enhancing high speed performance and/or measurement accuracy of the detection circuit 360.

The first counter 345 is controlled by the ring oscillator clock signal CKR0 and counts the exclusive-OR signal EXOR to generate a first count signal CNT1[19:0], which is 20 bits in this example. The first counter 345 is also selectively reset by the FSM 348 using a reset signal RESETB. The second counter 346 is controlled by the ring oscillator clock signal CKR0 and counts the enable signal ENRO provided by the FSM 348 to generate a second count signal CNT2[19:0], which is 20 bits in this example. The second count signal CNT2[19:0] indicates a number of cycles of the ring oscillator clock signal CKR0 that occur over a measurement interval (corresponding to a duration that the enable signal ENRO is active, in this example). The second counter 346 is also selectively reset by the FSM 348 using the reset signal RESETB.

Thus, in this embodiment, the reference clock signal CLKREF and the delayed clock signal CLKDEL are quantized and thereafter applied to an exclusive-OR operation. In certain implementations, the reference clock signal CLKREF and the delayed clock signal CLKDEL are nominally phase-shifted by 45 degrees, in which case the exclusive-OR signal EXOR should have a 0.25/0.75 duty cycle.

As shown in FIG. 8, the FSM 348 provides a frequency control signal F[2:0] (three bits, in this example) to control an oscillation frequency of the ring oscillator 347. In certain implementations, the FSM 348 performs a stochastic technique to generate a detection signal DET based on estimating the duty cycle of the exclusive-OR signal EXOR. For example, when a measurement enable signal ENMEAS is activated (for instance, transitions from LOW-to-HIGH), the reset signal RESETB and the enable signal ENRO both go HIGH. At this point, the first counter 345, the second counter 346, and the ring oscillator 347 are enabled, and the FSM 348 controls the frequency of the ring oscillator 347 (using F[2:0]) to perform a random walk across the period of the clocks.

With continuing reference to FIG. 8, the second counter 346 increments on each rising edge of the ring oscillator clock signal CKR0 up to a threshold set by N[3:0]. Thus, in this example, the total count is $2^{3+N[3:0]}$ (for instance, for N=9, the second counter 346 counts to 8192 at which point the enable signal ENRO goes LOW). As shown in FIG. 8, the first counter 345 increments when the exclusive-OR signal EXOR is HIGH.

In one example, the exclusive-OR signal EXOR has a 25% duty cycle for correct alignment. When operating with correct phase difference, since the duty cycle of exclusive-OR signal EXOR is 25%, the average output of the first count signal CNT1[19:0] when ENRO goes LOW should be about one fourth of $2^{3+N[3:0]}$, for instance, 2048 when N[3:0]=9.

The FSM 348 thus processes the first count signal CNT1[19:0] and the second count signal CNT2[19:0] to generate a detection signal DET indicating phasing between the divided clock signals. The detection signal DET can be used to by a digital circuit (for example, the digital circuit 5 of FIG. 1) to set a scaling factor α for interpolation. For example, the digital circuit can track the ratio indicated by the detection signal DET and increment/decrement a phase code accordingly.

In certain embodiments, a calibration routine runs at startup and determines the phase code that results in a 25% ratio for CKBUF0 and CKBUF45, and then switches the measure circuit inputs to CKBUF90 and CKBUF135 and does the same. Additionally, the averages of the two results can be used.

Although various clock signal phases have been described, the phase detection circuit 360 can measure phasing between any two suitable clock signals. In another example, the circuit 360 measures the phase skew between CKBUF0 and CKBUF45 and then between CKBUF90 and CKBUF45 to determine the quadrature error of the input clocks.

Applications

Devices employing the above described schemes can be implemented into various electronic devices in a wide range of applications including, but not limited to, electronic timing systems such as clock and data recovery systems. Examples of electronic devices that can be implemented with a multiphase clock generator include telecommunications systems, optical networks, and chip-to-chip communication.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A multiphase clock generator comprising:
    a first clock buffer configured to generate a first output clock signal based on buffering a first input clock signal;
    a second clock buffer configured to generate a second output clock signal based on buffering a second input clock signal; and
    a first clock interpolation circuit configured to generate a third output clock signal based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

2. The multiphase clock generator of claim 1, further comprising a phase detection circuit configured to generate a phase detection signal based on comparing the third output clock signal to at least one of the first output clock signal or the second output clock signal.

3. The multiphase clock generator of claim 2, wherein the first adjustable current and the second adjustable current are controlled by a scaling signal, the multiphase clock generator further comprising a digital circuit configured to set a value of the scaling signal based on the phase detection signal.

4. The multiphase clock generator of claim 2, wherein the phase detection circuit includes a first clock input, a second clock input, a quantization and logic circuit configured to generate an output signal indicating when the first clock input and the second clock input are in different states, an oscillator configured to output a control clock signal, a first counter controlled by the control clock signal and configured to count the output signal, a second counter configured to count a number of cycles of the control clock signal, and a control circuit configured to generate the phase detection signal based on a ratio of a first count signal from the first counter and a second count signal from the second counter.

5. The multiphase clock generator of claim 4, wherein the control circuit is configured to control the oscillator to set an oscillation frequency of the control clock signal, wherein the control circuit is configured to control the oscillator to perform a random walk in frequency.

6. The multiphase clock generator of claim 4, wherein the quantization and logic circuit is configured to generate the output signal based on an exclusive-OR operation of a state of the first clock input and a state of the second clock input.

7. The multiphase clock generator of claim 1, wherein the first clock interpolation circuit includes a first plurality of interpolation cells controlled by the first input clock signal and a second plurality of interpolation cells controlled by the second input clock signal, wherein the first adjustable current is set by activating a portion of the first plurality of interpolation cells and the second adjustable current is set by activating a portion of the second plurality of interpolation cells.

8. The multiphase clock generator of claim 7, wherein a first interpolation cell of the first plurality of interpolation cells comprises a first current source, a second current source, a first pair of transistors connected in series between the first current source and a first output, a second pair of transistors connected in series between the first current source and a second output, a third pair of transistors connected in series between the second current source and the first output, and a fourth pair of transistors connected in series between the second current source and the second output.

9. The multiphase clock generator of claim 8, wherein one of the first current source or the second current source is biased by a fixed bias voltage, and the other of the first current source or the second current source is biased with feedback to control a common-mode voltage of the first output and the second output.

10. The multiphase clock generator of claim 1, wherein the first output clock signal has a phase of about 0°, the second output clock signal has a phase of about 90°, and the third output clock signal has a phase difference of about 45° from at least one of the first output clock signal or the second output clock signal.

11. The multiphase clock generator of claim 1, wherein the first clock interpolation circuit is further configured to generate a fourth output clock signal that is logically inverted relative to the third output clock signal.

12. The multiphase clock generator of claim 11, further comprising:
    a third clock buffer configured to generate a fifth output clock signal based on buffering a third input clock signal;
    a fourth clock buffer configured to generate a sixth output clock signal based on buffering a fourth input clock signal; and
    a second clock interpolation circuit configured to generate a seventh output clock signal based on interpolating the second input clock signal and the third input clock signal, and an eighth output clock signal corresponding to a complement of the seventh output clock signal.

13. The multiphase clock generator of claim 12, wherein the first input clock signal, the second input clock signal, the third input clock signal, and the fourth input clock signal are evenly separated in phase and of a common frequency, and wherein the first output clock signal, the second output clock signal, the third output clock signal, the fourth output clock signal, the fifth output clock signal, the sixth output clock signal, the seventh output clock signal, and the eighth output clock signal are evenly separated in phase and of the common frequency.

14. The multiphase clock generator of claim 1, wherein a delay of the first clock buffer and a delay of the second clock buffer is matched to a delay of the first clock interpolation circuit.

15. A clock and data recovery (CDR) system comprising:
    a data sampler configured to sample a data stream at a center;
    an edge sampler configured to sample the data stream at an edge; and
    a multiphase clock generator comprising:
        a first clock buffer configured to generate a first output clock signal for the data sampler based on buffering a first input clock signal;
        a second clock buffer configured to generate a second output clock signal for the data sampler based on buffering a second input clock signal; and
        a first clock interpolation circuit configured to generate a third output clock signal for the edge sampler based on multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

16. The CDR system of claim 15, wherein the first clock interpolation circuit is further configured to generate a fourth output clock signal for the edge sampler, wherein the fourth output clock signal is logically inverted relative to the third output clock signal.

17. The CDR system of claim 15, wherein the first clock interpolation circuit includes a first plurality of interpolation cells controlled by the first input clock signal and a second plurality of interpolation cells controlled by the second input clock signal, wherein the first adjustable current is set by activating a portion of the first plurality of interpolation cells and the second adjustable current is set by activating a portion of the second plurality of interpolation cells.

18. The CDR system of claim 15, wherein the multiphase clock generator further comprises:
a third clock buffer configured to generate a fifth output clock signal for the data sampler based on buffering a third input clock signal;
a fourth clock buffer configured to generate a sixth output clock signal for the data sampler based on buffering a fourth input clock signal; and
a second clock interpolation circuit configured to generate a seventh output clock signal for the edge sampler based on interpolating the second input clock signal and the third input clock signal, and an eighth output clock signal for the edge sampler, the eighth output clock signal corresponding to a complement of the seventh output clock signal.

19. The CDR system of claim 15, further comprising a phase detection circuit configured to generate a phase detection signal based on comparing the third output clock signal to at least one of the first output clock signal or the second output clock signal, and a digital circuit configured to control the first adjustable current and the second adjustable current based on the phase detection signal.

20. A method of multiphase clock generation, the method comprising:
buffering a first input clock signal to generate a first output clock signal using a first clock buffer;
buffering a second input clock signal to generate a second output clock signal using a second clock buffer; and
generating a third output clock signal based on interpolating the first input clock signal and the second input clock signal using a clock interpolation circuit, wherein generating the third output clock signal based on interpolating the first input clock signal and the second input clock signal includes multiplying the first input clock signal by a first adjustable current to generate a first multiplied current, multiplying the second input clock signal by a second adjustable current to generate a second multiplied current, combining the first multiplied current and the second multiplied current to generate a combined current, and integrating the combined current.

* * * * *